US010157962B2

(12) United States Patent
Chen et al.

(10) Patent No.: US 10,157,962 B2
(45) Date of Patent: Dec. 18, 2018

(54) RESISTIVE RANDOM ACCESS MEMORY

(71) Applicant: Winbond Electronics Corp., Taichung (TW)

(72) Inventors: Frederick Chen, Hsinchu County (TW); Ping-Kun Wang, Taichung (TW); Shao-Ching Liao, Miaoli County (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/726,626

(22) Filed: Jun. 1, 2015

(65) Prior Publication Data

US 2016/0351623 A1    Dec. 1, 2016

(51) Int. Cl.
*H01L 27/00* (2006.01)
*H01L 27/24* (2006.01)
*H01L 45/00* (2006.01)

(52) U.S. Cl.
CPC ...... *H01L 27/2436* (2013.01); *H01L 27/2463* (2013.01); *H01L 27/2472* (2013.01); *H01L 45/04* (2013.01); *H01L 45/08* (2013.01); *H01L 45/12* (2013.01); *H01L 45/1233* (2013.01); *H01L 45/1246* (2013.01); *H01L 45/1253* (2013.01); *H01L 45/1273* (2013.01); *H01L 45/146* (2013.01); *H01L 45/147* (2013.01)

(58) Field of Classification Search
CPC ............................ H01L 27/2463; H01L 45/04
See application file for complete search history.

(56) References Cited

U.S. PATENT DOCUMENTS

| 8,846,484 | B2 * | 9/2014 | Lee | H01L 45/08 257/E21.004 |
|---|---|---|---|---|
| 2007/0215852 | A1 | 9/2007 | Lung | |
| 2008/0043522 | A1 | 2/2008 | Fuji et al. | |
| 2008/0099753 | A1 | 5/2008 | Song et al. | |
| 2008/0170428 | A1 | 7/2008 | Kinoshita | |

(Continued)

FOREIGN PATENT DOCUMENTS

| CN | 101207178 | 6/2008 |
|---|---|---|
| CN | 103907187 | 7/2014 |

(Continued)

OTHER PUBLICATIONS

"Office Action of Taiwan Counterpart Application", dated Aug. 25, 2016, p. 1-p. 5.

(Continued)

*Primary Examiner* — William Harriston
(74) *Attorney, Agent, or Firm* — JCIPRNET (57) ABSTRACT

A resistive random access memory is provided. The resistive memory cell includes a substrate, a transistor on the substrate, a bottom electrode on the substrate and electrically connected to the transistor source/drain, several top electrodes on the bottom electrode, several resistance-switching layers between the top and bottom electrode, and several current limiting layers between the resistance-switching layer and top electrodes. The cell could improve the difficulty on recognizing 1/0 signal by current at high temperature environment and save the area on the substrate by generating several conductive filaments at one transistor location.

16 Claims, 8 Drawing Sheets

(56) References Cited

U.S. PATENT DOCUMENTS

| | | | |
|---|---|---|---|
| 2009/0200640 A1* | 8/2009 | Hosoi | H01L 27/101 257/536 |
| 2010/0032641 A1* | 2/2010 | Mikawa | G11C 13/0007 257/3 |
| 2010/0182821 A1* | 7/2010 | Muraoka | G11C 11/5685 365/148 |
| 2012/0104344 A1 | 5/2012 | Kakehashi | |
| 2013/0026438 A1* | 1/2013 | Wang | H01L 45/1233 257/4 |
| 2013/0028003 A1 | 1/2013 | Wang et al. | |
| 2013/0214237 A1* | 8/2013 | Tendulkar | H01L 45/08 257/4 |
| 2014/0124725 A1 | 5/2014 | Chi et al. | |
| 2014/0361864 A1* | 12/2014 | Fukuda | C23C 14/0036 338/20 |

FOREIGN PATENT DOCUMENTS

| | | |
|---|---|---|
| JP | 2006127583 | 5/2006 |
| JP | 2010135581 | 6/2010 |
| JP | 2012094759 | 5/2012 |
| TW | 201327794 | 7/2013 |
| WO | 2005066969 | 7/2005 |
| WO | 2008062688 | 5/2008 |
| WO | 2014038152 | 3/2014 |

OTHER PUBLICATIONS

"Search Report of Europe Counterpart Application", dated Oct. 17, 2016, p. 1-p. 10.

Chih-Wei Stanley Yeh et al, "Compact One-Transistor-N-RRAM Array Architecture for Advanced CMOS Technology," IEEE Journal of Solid-State Circuits 50(5), Feb. 27, 2015, pp. 1299-1309.

Chih-Wei Stanley Yeh et al.,"Compact One-Transistor-N-RRAM Array Architecture for Advanced CMOS Technology", IEEE Journal of Solid-State Circuits, vol. 50, No. 5, May 2015,pp. 1299-1309.

"Office Action of Japan Counterpart Application," dated Apr. 11, 2017, p. 1-p. 5.

"Office Action of China Counterpart Application", dated Mar. 5, 2018, p. 1-p. 6.

* cited by examiner

RESISTIVE RANDOM ACCESS MEMORY

BACKGROUND OF THE DISCLOSURE

1. Field of the Disclosure

The disclosure relates to a non-volatile memory, and particularly to a resistive random access memory (RRAM).

2. Description of Related Art

A resistive random access memory (RRAM) is a type of non-volatile memory. Due to numerous advantages of RRAM including simple structure, low operation voltage, rapid operation time, multi-bit storage, low cost, good durability, they are widely studied at the present. The basic structure of commonly used RRAM is composed of one transistor and one resistor (1T1R), or one diode and one resistor (1D1R). The resistance value of the resistor is changed by varying the applied bias, so that the device is in a high resistance state or a low resistance state, and thereby 0 or 1 of the digital signal is recognized.

However, the temperature of the environment where the RRAM is located is higher, the resistance value thereof in the high resistance state is lower and the resistance value thereof in the low resistance state is higher, thus misjudgment of 0 or 1 of the digital signal of the device may be caused. Therefore, the issue to overcome the difficulty in recognizing the digital signal of RRAM device at high temperature environment becomes the main study task in the current RRAM technology and development.

SUMMARY OF THE DISCLOSURE

The disclosure provides a resistive random access memory (RRAM) (i.e., 1TnR structure, n is a integer more than 1), which may solve the problem of difficulty in recognizing the 0 and 1 signal by the current at high temperature environment, also save the occupied area of the substrate and increase the level of integration of the device.

The RRAM of the disclosure includes a substrate, a transistor, a bottom electrode, a plurality of top electrodes, a plurality of resistance-switching layers and a plurality of current limiting layers. The transistor is disposed on the substrate. The bottom electrode is disposed on the substrate and electrically connected to a source/drain of the transistor. The top electrodes are disposed on the bottom electrode. The resistance-switching layers are respectively disposed between the bottom electrode and the top electrodes. The current limiting layers are respectively disposed between the resistance-switching layers and the top electrodes.

According to an exemplary embodiment of the disclosure, a number of the top electrodes is 4 or more.

According to an exemplary embodiment of the disclosure, the resistance-switching layers are integrally formed as one.

According to an exemplary embodiment of the disclosure, the RRAM further includes a plurality of insulating layers. The insulating layers are respectively disposed between the resistance-switching layers and the top electrodes. Each of the current limiting layers respectively covers the sidewalls of the insulating layers.

According to an exemplary embodiment of the disclosure, the RRAM further includes a plurality of insulating layers. The insulating layers are respectively disposed on the current limiting layers. The top electrodes are respectively disposed on the insulating layers, extend downwardly and cover the sidewalls of the insulating layers and are directly electrically connected to the current limiting layers.

According to an exemplary embodiment of the disclosure, the bottom electrode is ring-shaped.

According to an exemplary embodiment of the disclosure, a material of the insulating layer includes silicon oxide.

According to an exemplary embodiment of the disclosure, a material of the top electrodes and the bottom electrode includes TiN or ITO.

According to an exemplary embodiment of the disclosure, a material of the resistance-switching layers includes $Ta_2O_5$ or $HfO_2$.

According to an exemplary embodiment of the disclosure, a material of the current limiting layers includes TaO, $TaO_2$, $TaO_x$, $TiO_x$, $HfO_x$, $ZrO_x$, or $AlO_x$, x represents a substoichiometric ratio after adjusted.

According to an exemplary embodiment of the disclosure, an extending direction of the top electrodes and an extending direction of a word line which connects to a gate electrode of the transistor are perpendicular to each other or parallel to each other.

In light of the above, in the disclosure, through the structure that a plurality of filaments are connected in parallel on the drain region of the transistor (namely, 1TnR structure, n is the number of filaments), the problem of difficulty in recognizing the difference between 0 and 1 digital signal of the device at a high temperature environment may be solved, and thereby effect of saving the occupied area of the substrate is achieved.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

In the exemplary embodiments described below, wherever possible, the same or similar reference numbers are used in the drawings and the description to refer the same or like parts, and the description thereof is simplified or omitted.

Embodiment 1

Figure 1A:
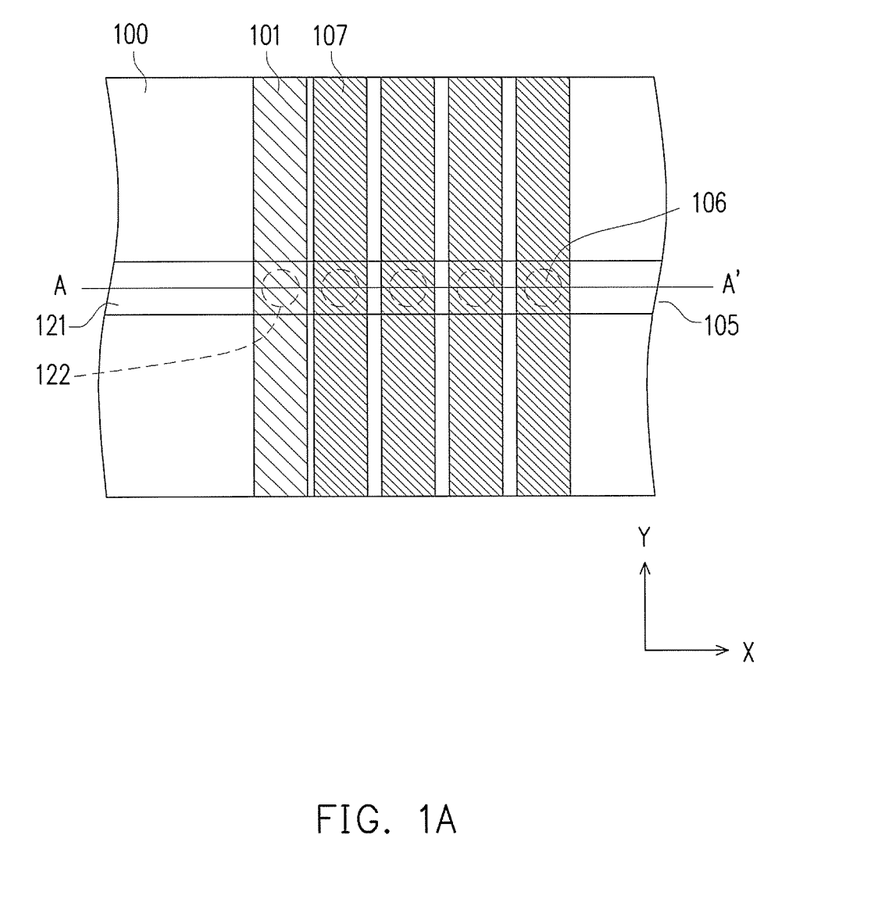
FIG. 1A is a schematic top view of a RRAM according to Embodiment 1 of the disclosure.
Figure 1B:
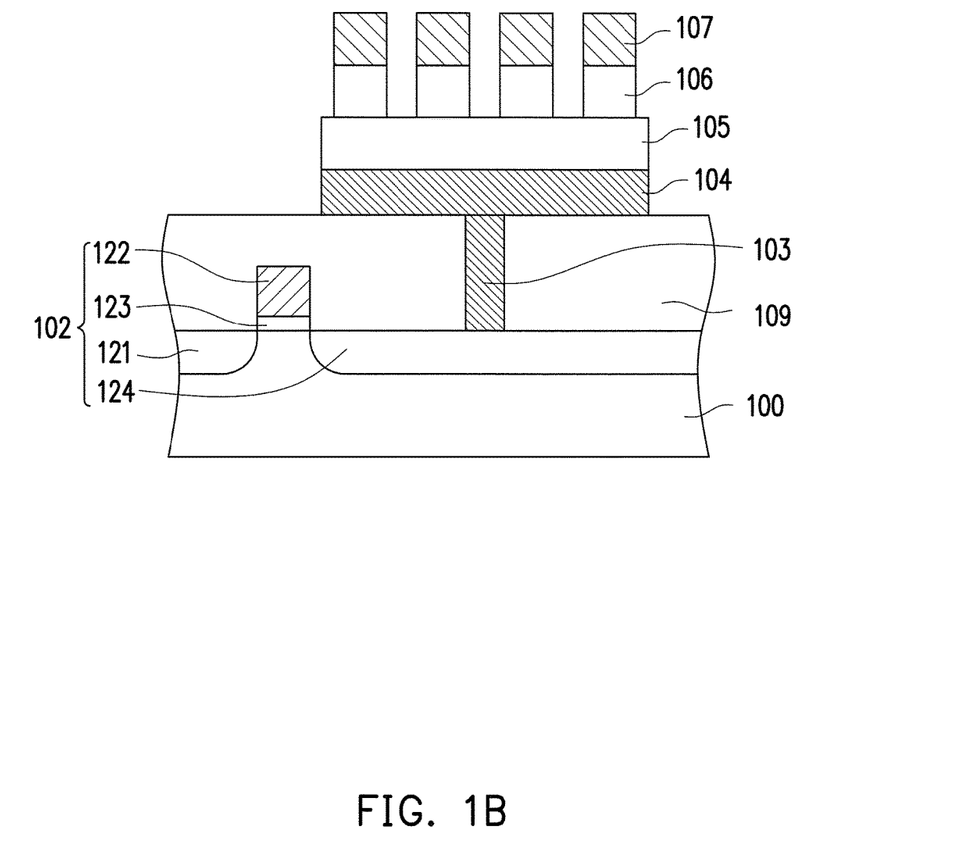
FIG. 1B is a schematic cross-sectional view of a RRAM according to Embodiment 1 of the disclosure.
Figure 1C:
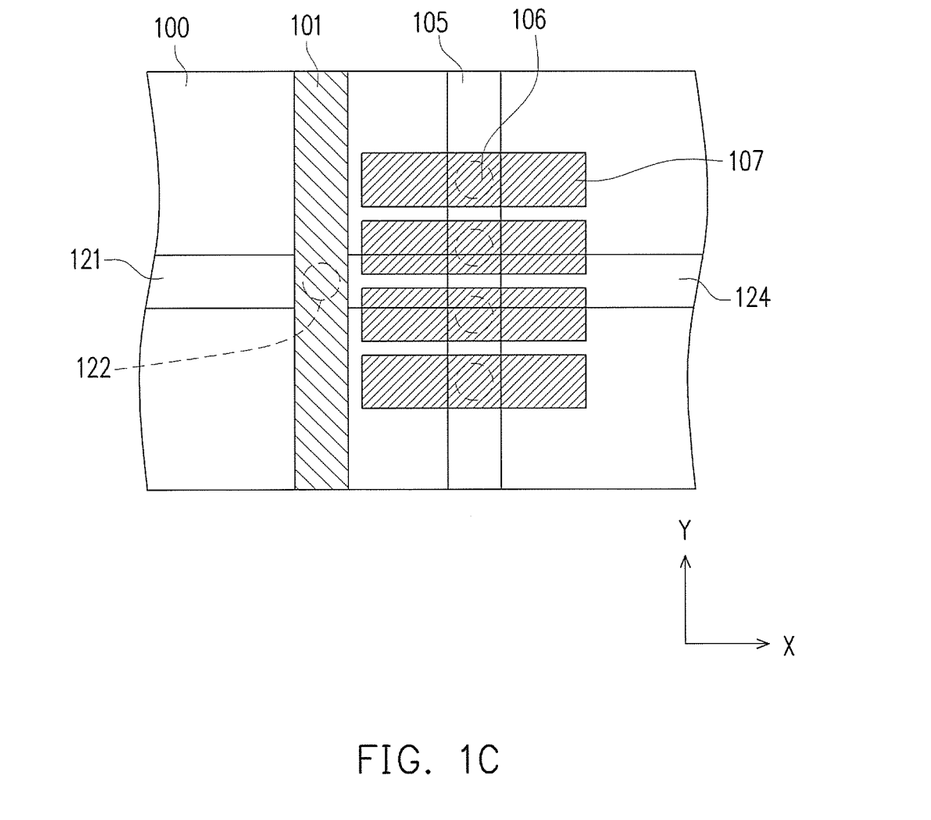
FIG. 1C is a schematic top view of a RRAM according to another embodiment of the disclosure.

FIG. 1A is a schematic top view of a RRAM according to Embodiment 1 of the disclosure. FIG. 1B is a schematic cross-sectional view of a RRAM according to Embodiment 1 of the disclosure, wherein FIG. 1B is a cross-sectional view along line A-A' in FIG. 1A. FIG. 1C is a schematic top view of a RRAM according to another embodiment of the disclosure.

Referring to FIG. 1A and FIG. 1B, the RRAM of the disclosure includes a transistor 102, a bottom electrode 104, a resistance-switching layer 105, a plurality of current limiting layers 106 and a plurality of top electrodes 107.

A 1T4R structure is exemplified for illustration purpose only in the embodiment, and the disclosure should not be limited to the 1T4R structure.

The transistor 102 is disposed on the substrate 100. The substrate 100 is, for example, an N-type silicon substrate or a P-type silicon substrate. The transistor 102 includes a gate electrode 122, a gate dielectric layer 123, a source region 121 and a drain region 124.

The gate electrode 122 is disposed on the substrate 100, and the material of the gate electrode 122 is doped polysilicon, for example. The gate dielectric layer 123 is disposed between the gate electrode 122 and the substrate 100. The material of the gate dielectric layer 123 is, for example, silicon oxide, and the material of the gate dielectric layer 123 may also be other dielectric materials. The source region 121 and the drain region 124 are respectively disposed within the substrate 100 at the two sides of the gate electrode 122.

The bottom electrode 104 is disposed on the substrate 100. The material of the bottom electrode 104 is, for example, titanium nitride (TiN) or indium tin oxide (ITO). The bottom electrode 104 is electrically connected to the drain region 124 of the transistor 102 via a plug 103. The plug 103 is disposed within the inter-layer insulating layer 109, for example, and the bottom electrode 104 is disposed on the inter-layer insulating layer 109.

The top electrodes 107 are respectively disposed on the bottom electrode 104. The material of the top electrodes 107 is, for example, titanium nitride (TiN) or indium tin oxide (ITO). In the embodiment, the extending direction (Y direction) of the top electrodes 107 and the extending direction (Y direction) of the word line 101 which connects to the gate electrode 122 of the transistor 102 are parallel to each other, for example. Certainly, in another embodiment, as shown in FIG. 1C, the extending direction (X direction) of the top electrodes 107 and the extending direction (Y direction) of the word line 101 which connects to the gate electrode 122 of the transistor 102 are perpendicular to each other.

The resistance-switching layer 105 is disposed between the bottom electrode 104 and the top electrodes 107. The material of the resistance-switching layer 105 is, for example, $Ta_2O_5$ or $HfO_2$. In the embodiment, for example, the resistance-switching layer 105 disposed between the bottom electrode 104 and the top electrodes 107 is integrally formed as one.

The current limiting layers 106 are respectively disposed between the resistance-switching layer 105 and the top electrodes 107. The material of the current limiting layers 106 includes, for example, TaO, $TaO_2$, $TaO_x$, $TiO_x$, $HfO_x$, $ZrO_x$, or $AlO_x$, wherein x represents a substoichiometric ratio after adjusted. The resistance value of the current limiting layers 106 is lower than the resistance value of the resistance-switching layer 105 which is in a low resistance state, but is higher than the resistance value of the source region and the drain region of the transistor. For instance, when the material of the resistance-switching layer 105 is $Ta_2O_5$, the material of the current limiting layers 106 is TaO, $TaO_2$, $TaO_x$; when the material of the resistance-switching layer 105 is $HfO_2$, the material of the current limiting layers 106 is $TaO_x$, $TiO_x$, $HfO_x$, $ZrO_x$, or $AlO_x$.

In the embodiment, a plurality of top electrodes 107 and a whole layer of resistance-switching layer 105 are disposed on the bottom electrode 104, wherein the bottom electrode 104, the resistance-switching layer 105, the current limiting layers 106 and each top electrode 107 constitute a plurality of filaments, and so called multi-partition resistive random access memory is formed. When performing programming operation, voltage may be selectively applied to the top electrodes respectively to change the conductive state of each of the resistance-switching layer 105, in order to produce a plurality of states of filaments which are separable. In read-out operation, the states of all filaments are read out, thus achieving the purpose of reading out the memory being in the high resistance state or being in the low resistance state (i.e., signal 0 or 1) easily by the current value and also achieving the effect of saving the occupied area of the substrate.

Embodiment 2

Figure 2:
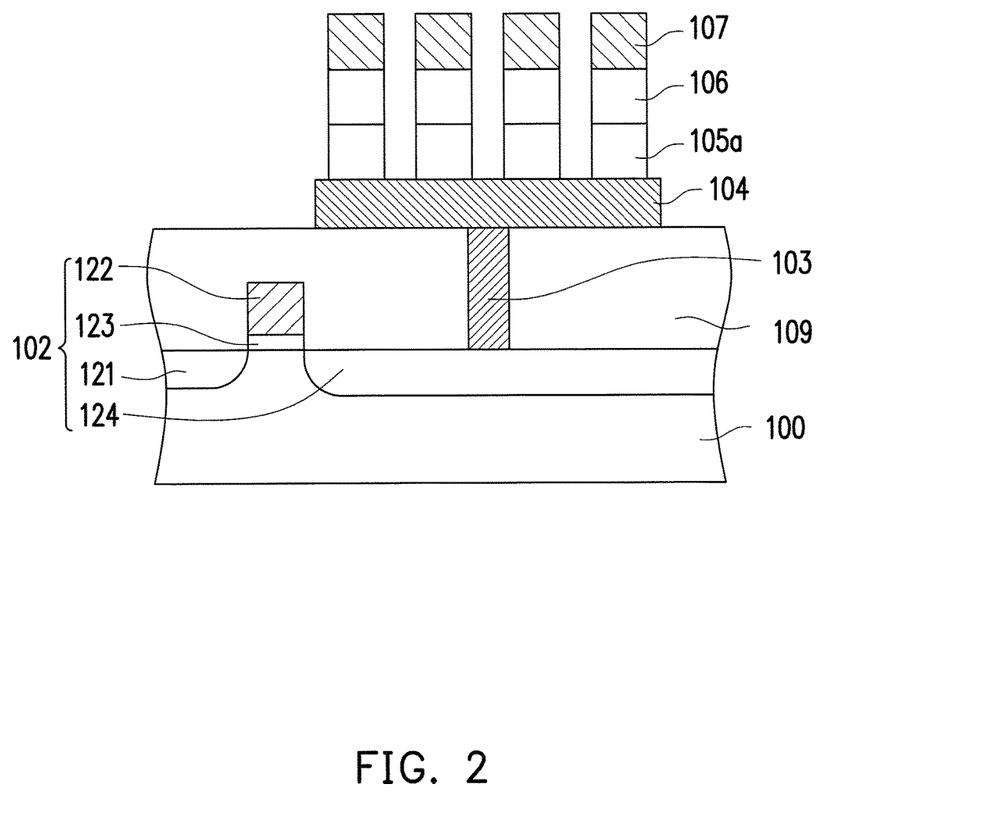
FIG. 2 is a schematic cross-sectional view of a RRAM according to Embodiment 2 of the disclosure.

FIG. 2 is a schematic cross-sectional view of a RRAM according to Embodiment 2 of the disclosure. FIG. 2 is also a cross-sectional view along line A-A' in FIG. 1A.

The RRAM includes a transistor 102, a bottom electrode 104, a plurality of resistance-switching layers 105a, a plurality of current limiting layers 106 and a plurality of top electrodes 107.

A 1T4R structure is exemplified for illustration purpose only in the embodiment, and the disclosure should not be limited to the 1T4R structure. Wherever possible in the following, if the materials and characteristics of the components are not in detailed description, they are assumed as the same or similar to Embodiment 1.

In the RRAM of the embodiment, the transistor 102 is disposed on the substrate 100. The transistor 102 includes a gate electrode 122, a gate dielectric layer 123, a source region 121 and a drain region 124. The gate electrode 122 is disposed on the substrate 100 and the gate dielectric layer 123 is disposed between the gate electrode 122 and the substrate 100. The source region 121 and the drain region 124 are respectively disposed within the substrate 100 at the two sides of a laminated body which is composed of the gate electrode 122 and the gate dielectric layer 123.

The bottom electrode 104 is disposed on the substrate 100. The bottom electrode 104 is electrically connected to the drain region 124 of the transistor 102 via a plug 103. The plug 103 is disposed within the inter-layer insulating layer 109, for example, and the bottom electrode 104 is disposed on the inter-layer insulating layer 109.

The top electrodes 107 are respectively independently disposed on the bottom electrode 104. In the embodiment, the extending direction (Y direction) of the top electrodes 107 and the extending direction (Y direction) of the word line 101 which connects to the gate electrode 122 of the transistor 102 are parallel to each other. In another embodiment, the extending direction (X direction) of the top electrodes 107 and the extending direction (Y direction) of the word line 101 which connects to the gate electrode 122 of the transistor 102 are perpendicular to each other.

The resistance-switching layers 105a are respectively disposed between the bottom electrode 104 and the top electrodes 107.

The current limiting layers 106 are respectively disposed between the resistance-switching layers 105a and the top electrodes 107.

In the embodiment, a plurality of top electrodes 107 and a corresponding number of resistance-switching layers 105a are disposed on the bottom electrode 104, wherein the bottom electrode 104, the resistance-switching layers 105, the current limiting layers 107 and the top electrodes 107 constitute a plurality of filaments, and so called multi-partition resistive random access memory is formed. When performing programming operation, voltage may be selectively applied to the top electrodes respectively to change the conductive state of each of the resistance-switching layers 105a, in order to produce a plurality of states of filaments which are separable. In read-out operation, the states of all filaments are read out, thus achieving the purpose of reading out the memory being in the high resistance state or being in the low resistance state (i.e., signal 0 or 1) easily by the current value and also achieving the effect of saving the occupied area of the substrate.

Embodiment 3

Figure 3A:
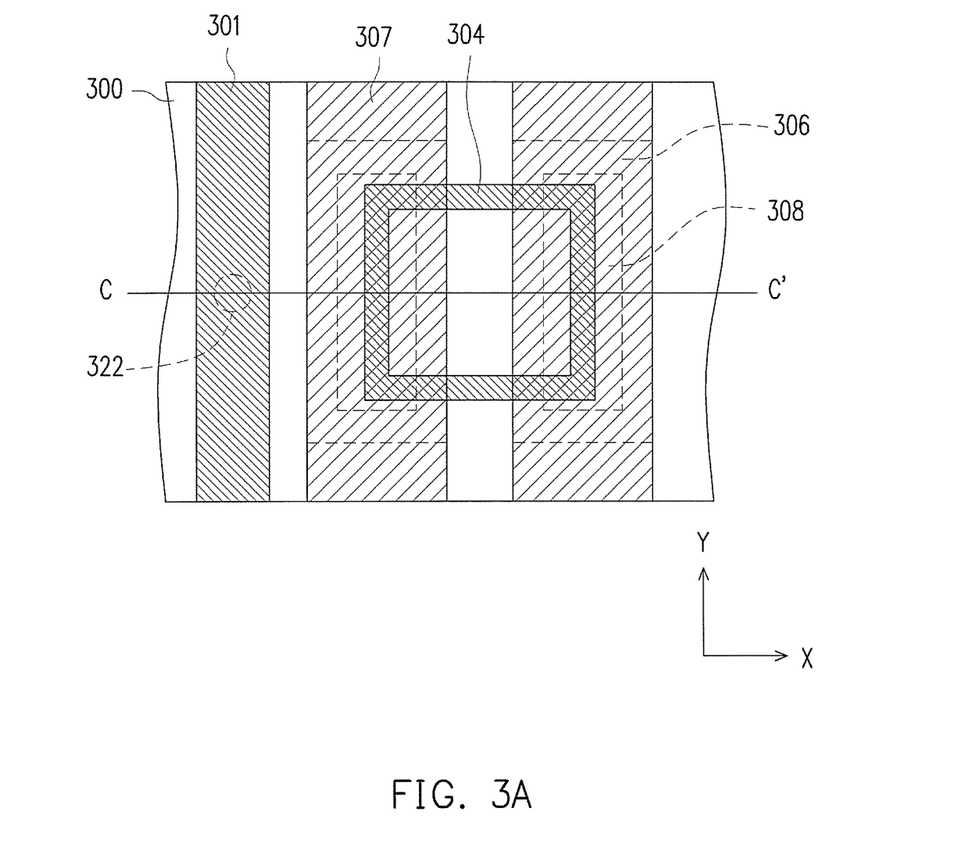
FIG. 3A is a schematic top view of a RRAM according to Embodiment 3 of the disclosure.
Figure 3B:
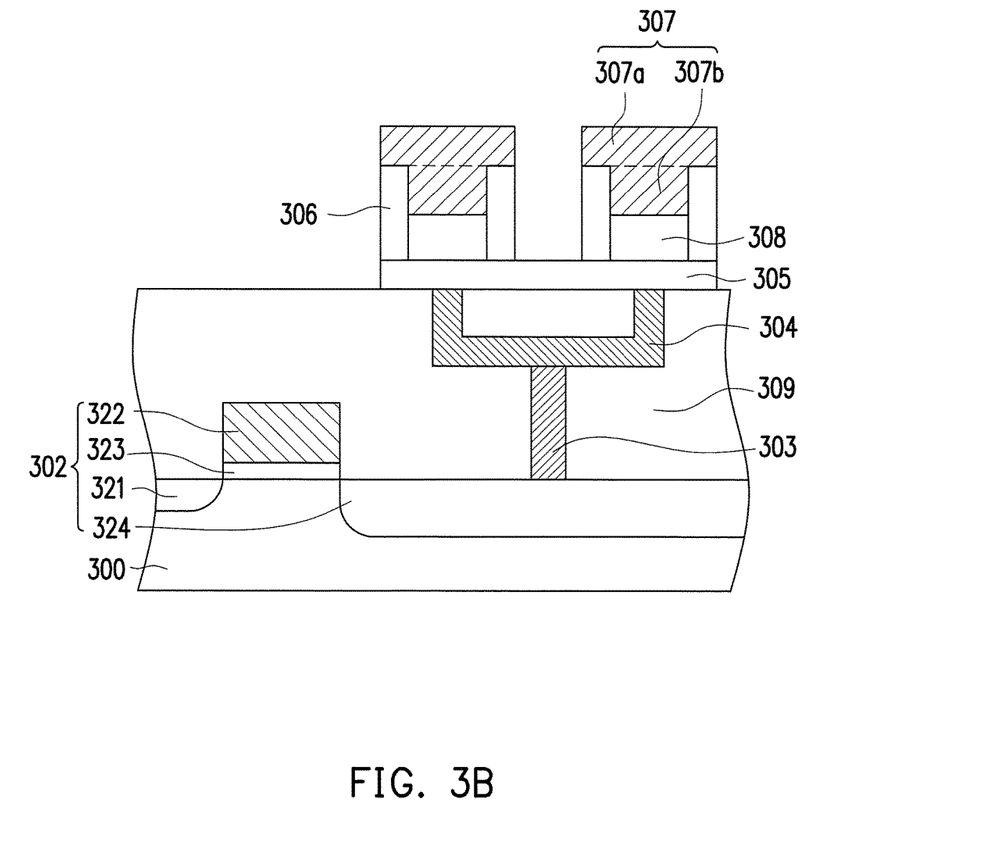
FIG. 3B is a schematic cross-sectional view of a RRAM according to Embodiment 3 of the disclosure.

Please refer to FIG. 3A and FIG. 3B. FIG. 3A is a schematic top view of a RRAM according to Embodiment 3 of the disclosure. FIG. 3 is a schematic cross-sectional view of a RRAM according to Embodiment 3 of the disclosure. FIG. 3B is a schematic cross-sectional view along line C-C' in FIG. 3A.

The RRAM includes a transistor 302, a bottom electrode 304, a resistance-switching layer 305, a plurality of insulating layers 308, a plurality of current limiting layers 306 and a plurality of top electrodes 307.

A 1T2R structure is exemplified for illustration purpose only in the embodiment, and the disclosure should not be limited to the 1T2R structure. Wherever possible in the following, if the materials and characteristics of the components are not in detailed description, they are assumed as the same or similar to Embodiment 1.

In the RRAM of the embodiment, the transistor 302 is disposed on the substrate 300. The transistor 302 includes a gate electrode 322, a gate dielectric layer 323, a source region 321 and a drain region 324. The gate electrode 322 is disposed on the substrate 300 and the gate dielectric layer 323 is disposed between the gate electrode 322 and the substrate 300. The source region 321 and the drain region 324 are respectively disposed within the substrate 300 at the two sides of a laminated body which is composed of the gate electrode 322 and the gate dielectric layer 323.

The inter-layer insulating layer 309 is disposed on the substrate 300. The material of the inter-layer insulating layer 309 is, for example, silicon oxide. The ring-shaped bottom electrode 304 is disposed within the inter-layer insulating layer 309, and the ring-shaped bottom electrode 304 is covered by the inter-layer insulating layer 309. The ring-shaped bottom electrode 304 is electrically connected to the drain region 324 of the transistor 302 via a plug 303.

The top electrodes 307 are respectively independently disposed on the bottom electrode 304. Each of the top electrodes 307 is composed of a first portion 307a and a second portion 307b.

The resistance-switching layer 305 is disposed between the bottom electrode 304 and the tow top electrodes 307.

The insulating layers 308 are respectively independently disposed between the resistance-switching layer 305 and the top electrodes 307. The material of the insulating layers 308 is, for example, silicon oxide.

The current limiting layers 306 are respectively independently disposed between the resistance-switching layer 305 and the top electrodes 307, and each of them covers the sidewalls of the insulating layer 308. Each of the top electrodes 307, together with each current limiting layer 306 and each insulating layer 308, constitute a laminated body individually, and each current limiting layer 306 also surrounds a portion of each top electrode 307. Namely, as shown in FIG. 3A, the current limiting layer 306 covers the sidewalls of the insulating layer 308, and a recess is formed above the insulating layer 308. The second portion 307b of the top electrode 307 is filled in the recess as such the current limiting layer 306 covers the second portion 307b of the top electrode 307. The first portion 307a of the top electrode 307 is disposed on the second portion 307b of the top electrode 307 and extends in the Y direction.

In the embodiment, the top electrodes 307 and a whole layer of the resistance-switching layer 305 are disposed on the bottom electrode 304, wherein the current limiting layer 306 is ring-shaped. The top electrodes 307, the current limiting layers 306, the resistance-switching layer 305 and the bottom electrode 304 constitute a plurality of filaments, and the so called multi-partition RRAM is formed. When performing programming operation, voltage may be selectively applied to the top electrodes respectively to change the conductive state of the resistance-switching layer 305, in order to produce a plurality of states of filaments which are separable. In read-out operation, the states of all filaments are read out, thus achieving the purpose of reading out the memory being in the high resistance state or being in the low resistance state (i.e., signal 0 or 1) easily by the current value and also achieving the effect of saving the occupied area of the substrate.

Embodiment 4

Figure 4A:
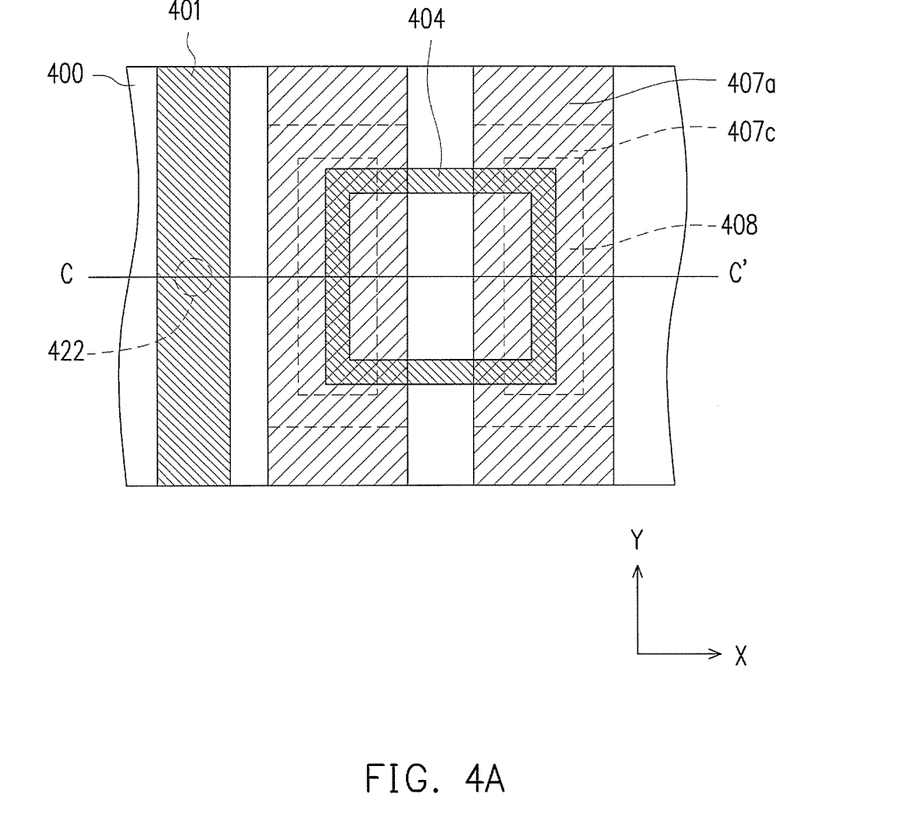
FIG. 4A is a schematic top view of a RRAM according to Embodiment 4 of the disclosure.
Figure 4B:
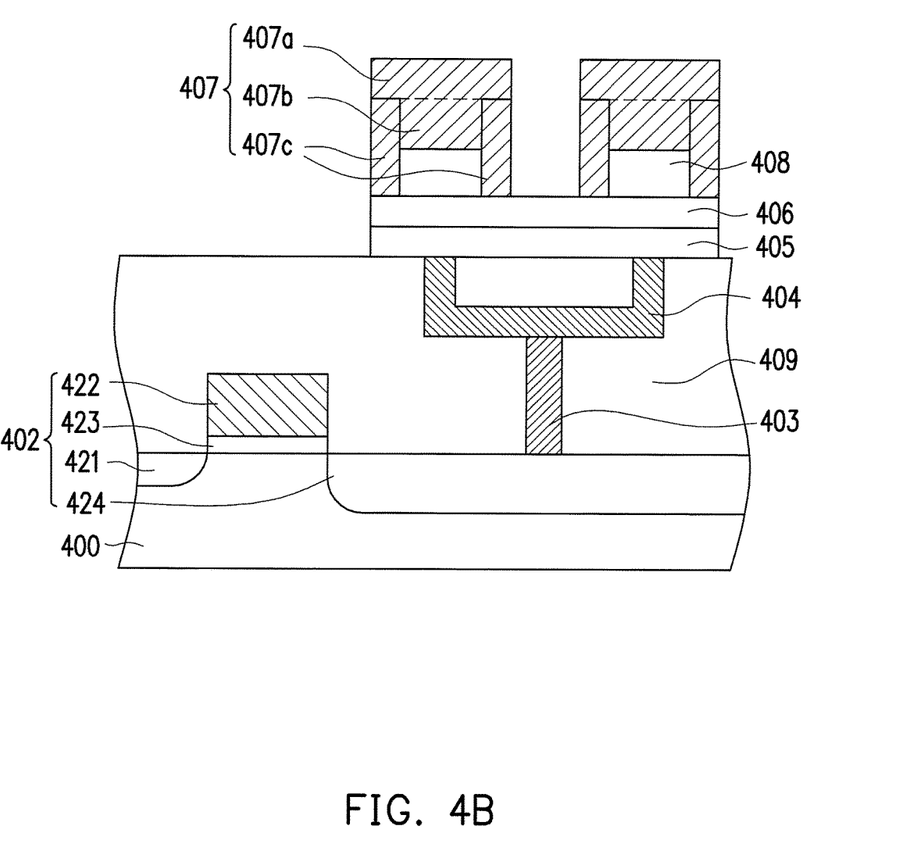
FIG. 4B is a schematic cross-sectional view of a RRAM according to Embodiment 4 of the disclosure.

Please refer to FIG. 4A and FIG. 4B. FIG. 4A is a schematic top view of a RRAM according to Embodiment 4 of the disclosure. FIG. 4B is a schematic cross-sectional view of a RRAM according to Embodiment 4 of the disclosure. FIG. 4B is a schematic cross-sectional view along line C-C' in FIG. 4A.

The RRAM includes a transistor 402, a bottom electrode 404, a resistance-switching layer 405, a plurality of insulating layers 406, a current limiting layer 407, a plurality of insulating layers 408 and a plurality of top electrodes 307.

A 1T2R structure is exemplified for illustration purpose only in the embodiment, and the disclosure should not be limited to the 1T2R structure. Wherever possible in the following, if the materials and characteristics of the components are not in detailed description, they are assumed as the same or similar to Embodiment 3.

In the RRAM of the embodiment, the transistor 402 is disposed on the substrate 400. The transistor 402 includes a gate electrode 422, a gate dielectric layer 423, a source region 421 and a drain region 424. The gate electrode 422 is disposed on the substrate 400 and the gate dielectric layer 423 is disposed between the gate electrode 422 and the substrate 400. The source region 421 and the drain region 424 are respectively disposed within the substrate 400 at the two sides of a laminated body which is composed of the gate electrode 422 and the gate dielectric layer 423.

The inter-layer insulating layer 409 is disposed on the substrate 400. The ring-shaped bottom electrode 404 is disposed within the inter-layer insulating layer 409, and the ring-shaped bottom electrode 404 is covered by the inter-layer insulating layer 409. The ring-shaped bottom electrode 404 is electrically connected to the drain region 424 of the transistor 402 via a plug 403.

The resistance-switching layer 405 is disposed on the bottom electrode 404. The current limiting layer 406 is disposed on the resistance-switching layer 405. The insulating layers 408 are respectively independently disposed on the current limiting layer 406.

The top electrodes 407 are respectively independently disposed on the two insulating layers 408, extend downwardly and cover the sidewalls of the insulating layers 408, so that the current limiting layer 406 is directly electrically connected to the top electrodes 407. Namely, each of the top electrodes 407 includes a first portion 407a, a second portion 407b and a third portion 407c. The second portion 407b of the top electrode 407 is disposed on the insulating layer 408. The third portion 407c of the top electrode 407 is disposed at the sidewalls of the insulating layer 408 and the second portion 407b of the top electrode 407, namely the third portion 407c of the top electrode 407 covers the insulating layer 408 and the second portion 407b of the top electrode 407. The first portion 407a of the top electrode 407 is disposed on the second portion 307b of the top electrode 407 and extends in the Y direction.

In the embodiment, the top electrodes 407 and a whole layer of the resistance-switching layer 405 are disposed on the bottom electrode 404, wherein the portion of the top electrode 407, which covers the insulating layer 408, is ring-shaped. The top electrodes 407, the current limiting layer 406, the resistance-switching layer 405 and the bottom electrode 404 constitute a plurality of filaments, and the so called multi-partition RRAM is formed. When performing programming operation, voltage may be selectively applied to the top electrodes respectively to change the conductive state of the resistance-switching layer 405, in order to produce a plurality of states of filaments which are separable. In read-out operation, the states of all filaments are read out, thus achieving the purpose of reading out the memory being in the high resistance state or being in the low resistance state (i.e., signal 0 or 1) easily by the current value and also achieving the effect of saving the occupied area of the substrate.

In light of the foregoing, in the disclosure, through the structure that a plurality of filaments are connected in parallel on the drain region of the transistor, the problem of difficulty in recognizing the difference between 0 and 1 digital signal of the device at a high temperature environment may be solved, and thereby effect of saving the occupied area of the substrate is achieved.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A resistive random access memory, comprising:
    a substrate;
    a transistor, disposed on the substrate;
    a bottom electrode, disposed on the substrate and electrically connected to a source/drain of the transistor;
    a plurality of top electrodes, disposed on the bottom electrode;
    at least one resistance-switching layer, disposed between the bottom electrode and the plurality of top electrodes, wherein the at least one resistance-switching layer is directly in contact with the bottom electrode; and
    a plurality of current limiting layers, respectively disposed between the at least one resistance-switching layer and the plurality of top electrodes, wherein each of the plurality of current limiting layers is a single-layered structure, the plurality of current limiting layers are directly in contact with the plurality of top electrodes and one of the at least one resistance-switching layer, and a resistance value of the current limiting layers is lower than a resistance value of the at least one resistance-switching layer in a low resistance state of the resistance-switching layer.

2. The resistive random access memory as claimed in claim 1, wherein a number of the plurality of top electrodes is 4 or more.

3. The resistive random access memory as claimed in claim 1, wherein a material of the plurality of top electrodes and the bottom electrode comprises TiN or ITO.

4. The resistive random access memory as claimed in claim 1, wherein a material of the at least one resistance-switching layer comprises $Ta_2O_5$ or $HfO_2$.

5. The resistive random access memory as claimed in claim 1, wherein a material of the plurality of current limiting layers comprises TaO, $TaO_2$, $TaO_x$, $TiO_x$, $HfO_x$, $ZrO_x$, or $AlO_x$, x represents a substoichiometric ratio of oxygen to metal in a molecule.

6. The resistive random access memory as claimed in claim 1, wherein an extending direction of the plurality of top electrodes and an extending direction of a word line which connects to a gate electrode of the transistor are perpendicular to each other or parallel to each other.

7. The resistive random access memory as claimed in claim 1, further comprising:
    a plurality of insulating layers, respectively disposed between the plurality of resistance-switching layers and the plurality of top electrodes;
    wherein each of the plurality of current limiting layers respectively covers sidewalls of the plurality of insulating layers.

8. The resistive random access memory as claimed in claim 7, wherein the bottom electrode is ring-shaped.

9. The resistive random access memory as claimed in claim 7, wherein a material of the plurality of top electrodes and the bottom electrode comprises TiN or ITO.

10. The resistive random access memory as claimed in claim 7, wherein a material of the plurality of resistance-switching layers comprises $Ta_2O_5$ or $HfO_2$.

11. The resistive random access memory as claimed in claim 7, wherein a material of the plurality of current limiting layers comprises TaO, $TaO_2$, $TaO_x$, $TiO_x$, $HfO_x$, $ZrO_x$, or $AlO_x$, x represents a substoichiometric ratio after adjusted.

12. The resistive random access memory as claimed in claim 1, further comprising:
    a plurality of insulating layers, respectively disposed on the plurality of current limiting layers;
    wherein the plurality of top electrodes are respectively disposed on the plurality of insulating layers, extend downwardly and cover sidewalls of the plurality of insulating layers and are directly electrically connected to the plurality of current limiting layers.

13. The resistive random access memory as claimed in claim 12, wherein the bottom electrode is ring-shaped.

14. The resistive random access memory as claimed in claim 12, wherein a material of the plurality of top electrodes and the bottom electrode comprises TiN or ITO.

15. The resistive random access memory as claimed in claim 12, wherein a material of the plurality of resistance-switching layers comprises $Ta_2O_5$ or $HfO_2$.

16. The resistive random access memory as claimed in claim 12, wherein a material of the plurality of current limiting layers comprises TaO, $TaO_2$, $TaO_x$, $TiO_x$, $HfO_x$, $ZrO_x$, or $AlO_x$, x represents a substoichiometric ratio after adjusted.

\* \* \* \* \*